(12) United States Patent
Nakamura et al.

(10) Patent No.: US 10,928,428 B2
(45) Date of Patent: Feb. 23, 2021

(54) MEASURING APPARATUS

(71) Applicant: HIOKI DENKI KABUSHIKI KAISHA, Nagano (JP)

(72) Inventors: Tetsuya Nakamura, Nagano (JP); Takashi Hirao, Nagano (JP); Yuta Akamatsu, Nagano (JP); Yuta Suzuki, Nagano (JP)

(73) Assignee: HIOKI DENKI KABUSHIKI KAISHA, Nagano (JP)

( * ) Notice: Subject to any disclaimer, the term of this patent is extended or adjusted under 35 U.S.C. 154(b) by 225 days.

(21) Appl. No.: 16/245,398

(22) Filed: Jan. 11, 2019

(65) Prior Publication Data

US 2019/0146018 A1 May 16, 2019

Related U.S. Application Data

(63) Continuation of application No. PCT/JP2017/024762, filed on Jul. 6, 2017.

(30) Foreign Application Priority Data

Jul. 12, 2016 (JP) .............................. JP2016-137411

(51) Int. Cl.
*G01R 27/14* (2006.01)
*G01R 15/09* (2006.01)
(Continued)

(52) U.S. Cl.
CPC .............. *G01R 27/14* (2013.01); *G01R 15/09* (2013.01); *G01R 15/125* (2013.01);
(Continued)

(58) Field of Classification Search
CPC ...... G01R 27/14; G01R 15/12; G01R 15/125; G01R 27/02; G01R 19/16; G01R 19/165;
(Continued)

(56) References Cited

U.S. PATENT DOCUMENTS 5,047,751 A * 9/1991 Miura ..................... G05F 1/569
340/661
6,147,521 A * 11/2000 Degoirat .......... G01R 19/16519
327/206
(Continued)

FOREIGN PATENT DOCUMENTS

CN         1404578 A     3/2003
CN       101499773 A     8/2009
(Continued)

OTHER PUBLICATIONS

Office Action issued in Chinese Counterpart Patent Appl. No. 201780038605.1, dated Jun. 24, 2020, along with an English translation thereof.
(Continued)

*Primary Examiner* — Son T Le
(74) *Attorney, Agent, or Firm* — Greenblum & Bernstein, P.L.C.

(57) ABSTRACT

The present invention aims to reduce the leakage current that flows when measuring a high voltage and includes: a voltage detector that detects a voltage and outputs a detection voltage; a current supplier that supplies a measurement current across a pair of input terminals via a protective resistor; and a processor that executes a voltage measurement process, which measures the voltage based on data indicating the detection voltage, and a resistance measurement process, which measures a resistance connected between the input terminals based on the voltage and the current. A first switch is connected in parallel to the protective resistor and the processor executes the voltage measurement process in a state where the first switch has been set open to measure the terminal voltage, and executes the resistance measurement process by setting the first switch
(Continued)

shorted when the voltage is equal to or below the reference voltage value.

3 Claims, 4 Drawing Sheets

(51) Int. Cl.
　　*G01R 15/12*　　　(2006.01)
　　*G01R 27/02*　　　(2006.01)
　　*G01R 19/165*　　(2006.01)
(52) U.S. Cl.
　　CPC ... *G01R 19/1659* (2013.01); *G01R 19/16523* (2013.01); *G01R 27/02* (2013.01)
(58) Field of Classification Search
　　CPC .......... G01R 19/16523; G01R 19/1659; G01R 15/09
　　See application file for complete search history.

(56) References Cited

U.S. PATENT DOCUMENTS

| | | | | |
|---|---|---|---|---|
| 7,230,456 | B2 * | 6/2007 | Dayley | G05F 1/40 |
| | | | | 327/143 |
| 7,642,788 | B2 * | 1/2010 | Gallavan | G01R 15/125 |
| | | | | 324/522 |
| 2003/0030440 | A1 | 2/2003 | Yugou | |
| 2007/0164759 | A1 | 7/2007 | Bordelon | |
| 2009/0045825 | A1 * | 2/2009 | Eng, Jr. | G01R 15/12 |
| | | | | 324/713 |
| 2009/0195205 | A1 | 8/2009 | Ide | |
| 2013/0245869 | A1 | 9/2013 | Nishida et al. | |
| 2014/0266155 | A1 * | 9/2014 | Cabot | G01R 15/125 |
| | | | | 324/140 R |
| 2015/0340186 | A1 | 11/2015 | Yoneda | |

FOREIGN PATENT DOCUMENTS

| | | |
|---|---|---|
| CN | 201422009 Y | 3/2010 |
| CN | 202290375 U | 7/2012 |
| CN | 102761272 A | 10/2012 |
| CN | 103308769 A | 9/2013 |
| CN | 105027252 A | 11/2015 |
| JP | H07-37482 A | 2/1995 |
| JP | 2005-114517 | 4/2005 |
| JP | 2006-105902 | 4/2006 |
| JP | 2009-074829 | 4/2009 |
| JP | 2012-068023 | 4/2012 |
| WO | 2007/082125 | 7/2007 |

OTHER PUBLICATIONS

Yoshiyuki Miyazawa et al., "3246 Pencil HiTESTER", HIOKI Technical Notes, 2003, vol. 24, No. 1, with English translation.
Official Communication issued in International Bureau of WIPO Patent Application No. PCT/JP2017/024762, dated Sep. 26, 2017.

* cited by examiner

MEASURING APPARATUS

CROSS-REFERENCE TO RELATED APPLICATION

The present application is a bypass continuation of PCT/JP2017/024762 filed Jul. 6, 2017, which claims the benefit of Japanese Patent Application No. 2016-137411, filed Jul. 12, 2016. The disclosure of each of the above-identified applications, including the specification, drawings, and claims, is incorporated herein by reference in its entirety.

TECHNICAL FIELD

The present invention relates to a measuring apparatus that measures at least a resistance value and a voltage value.

BACKGROUND ART

As one example of a measuring apparatus of this type, the present applicant has already proposed the measuring apparatus (or "digital multimeter") disclosed in Non Patent Literature 1 indicated below. As depicted in FIGS. 6 and 7 of Non Patent Literature 1, this measuring apparatus includes a pair of input terminals (a COM terminal and another terminal (or "V/Ω terminal") that serves as both a voltage measuring terminal and a resistance measuring terminal), an input circuit for measuring a voltage that is connected across the pair of input terminals, and an input circuit for measuring a resistance that is connected between the pair of input terminals.

Figure 4:
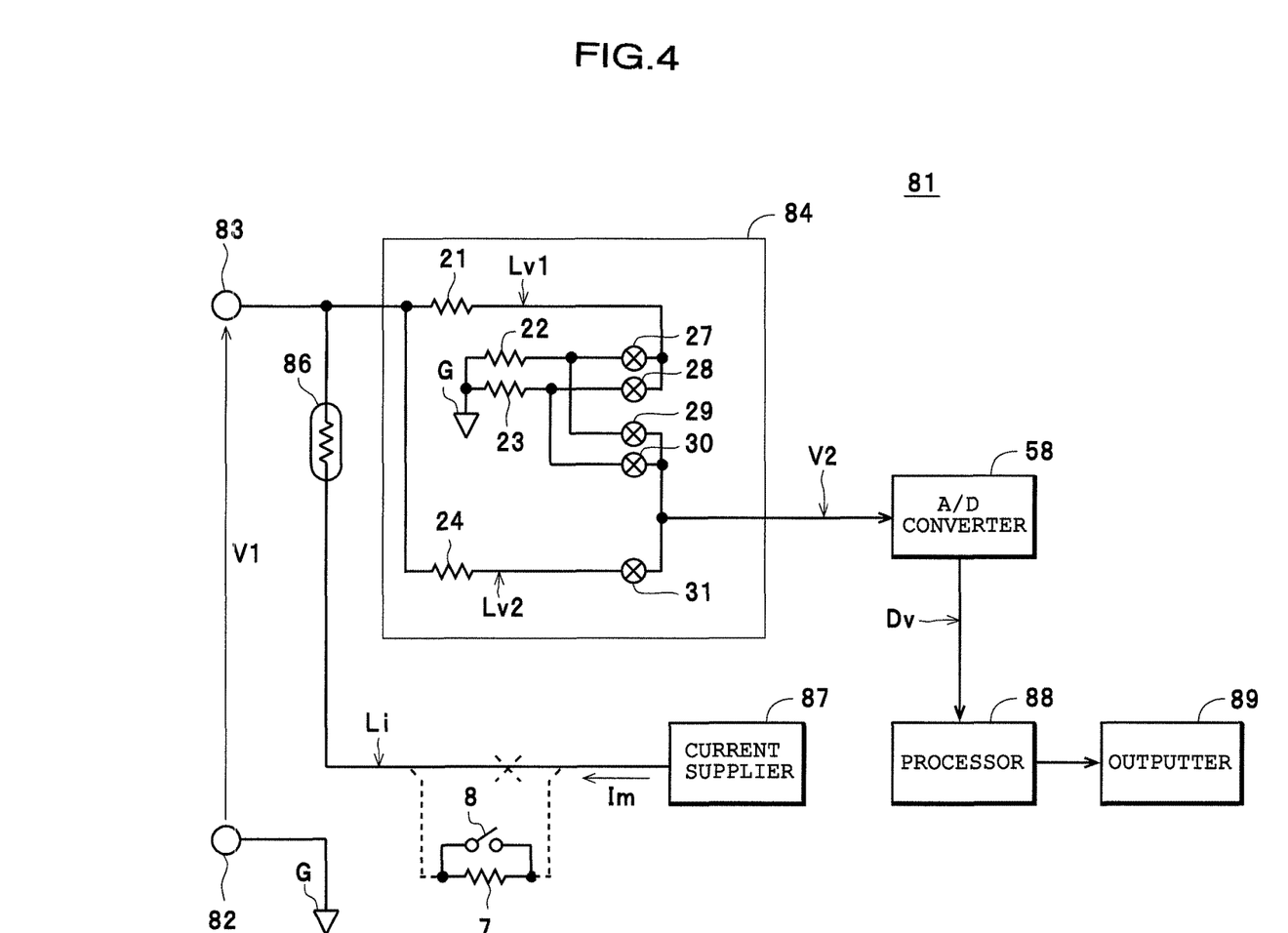
FIG. 4 is a diagram depicting the configuration of a measuring apparatus 81.

In more detail, as depicted in FIG. 4, this measuring apparatus 81 includes a pair of input terminals 82 and 83, a voltage detector 84, an A/D converter 85, a thermistor 86, a current supplier 87, a processor 88, and an outputter 89. One out of the input terminals 82 and 83 (in this example, the input terminal 82) is connected to a reference potential (or the "internal ground G") inside the apparatus, and functions as a COM terminal.

The voltage detector 84 detects a terminal voltage V1 across the input terminals 82 and 83 and outputs a detection voltage V2 with a voltage value in keeping with the voltage value of the terminal voltage V1. As one example, the voltage detector 84 includes a high voltage detecting circuit, which detects a high alternating current (AC) voltage or a high direct current (DC) voltage inputted across the input terminals 82 and 83 as the terminal voltage V1, divides this voltage, and outputs as the detection voltage V2, and a low voltage detecting circuit, which has a measurement current Im supplied from the current supplier 87 flow to a resistance connected across the input terminals 82 and 83, detects the voltage produced across both ends of the resistance as the terminal voltage V1, and outputs this voltage as it is (that is, without dividing) as the detection voltage V2.

As one example, the high voltage detecting circuit includes an input resistor 21 that is interposed on a first voltage detecting line Lv1 connected to the input terminal 83, a plurality of (in this example, two) "range resistors" (that is, voltage-dividing resistors) 22 and 23 provided corresponding to measurement ranges, and four switches 27, 28, 29, and 30 that selectively connect a range resistor, out of the range resistors 22 and 23, which corresponds to the measurement range presently in use to a first voltage detecting line Lv1 and output the terminal voltage V1 that has been divided by the range resistor connected to the first voltage detecting line Lv1 and the input resistor 21 to the A/D converter 85 as the detection voltage V2. The low voltage detecting circuit includes an input resistor 24 that is interposed on a second voltage detecting line Lv2 connected to the input terminal 83 and a switch 31 for outputting the terminal voltage V1 via the second voltage detecting line Lv2 to the A/D converter 85 as the detection voltage V2.

By inputting the detection voltage V2 and sampling the detection voltage V2 with a constant sampling cycle that is set in advance, the A/D converter 85 converts the detection voltage V2 to voltage data Dv indicating momentary values of the detection voltage V2 and outputs to the processor 88.

The current supplier 87 is configured so as to generate an output voltage, which has the internal ground G as a reference, at an output terminal so as to supply the measurement current Im (a constant DC current with a known current value) from the output terminal to the current supply line Li. The current supplier 87 is constructed with a low resistance (output resistance) between the output terminal and the internal ground G. To prevent a large current from flowing into the current supplier 87 due to the voltage inputted across the input terminals 82 and 83, a PTC thermistor 86 is interposed on the current supply line Li.

The processor 88 includes a computer and a memory (neither of which is illustrated) and executes, in accordance with an indication inputted from an operator, not illustrated, a designated measurement process out of a voltage measurement process and a resistance measurement process. As one example, the outputter 89 is composed of a display apparatus, such as a liquid crystal display, and displays measurement results of the respective measurement processes executed by the processor 88 on a screen.

With the measuring apparatus 81, when an indication of voltage measurement has been outputted to the processor 88 from the operator, not illustrated, in response to the user operating the operator, the processor 88 executes the voltage measurement process. During the voltage measurement process, the processor 88 sets the switch 31 inside the voltage detector 84 in an "off" state (that is, the processor 88 disconnects the low voltage detecting circuit and the A/D converter 85), and sets the required pair of switches out of the switches 27 to 30 (that is, one pair out of the pair of switches 27 and 29 and the pair of switches 28 and 30) at the "on" state and sets the remaining pair of switches (the other pair out of the pair of switches 27 and 29 and the pair of switches 28 and 30) at the "off" state to connect the range resistor corresponding to the appropriate measurement range out of the range resistors 22 and 23 to the first voltage detecting line Lv1 (that is, the processor 88 connects the high voltage detecting circuit and the A/D converter 85).

In this state, the voltage detector 84 divides the voltage (the terminal voltage V1) inputted across the input terminals 82 and 83 using the input resistor 21 and the range resistor (one of the range resistors 22 and 23) corresponding to the measurement range and outputs the divided voltage as the detection voltage V2 to the A/D converter 85. The A/D converter 85 converts the detection voltage V2 to the voltage data Dv and outputs the voltage data Dv. The processor 88 measures (calculates) the terminal voltage V1 based on the voltage data Dv outputted from the A/D converter 85 and displays the terminal voltage V1 on the outputter 89.

With this measuring apparatus 81, when an indication of resistance measurement has been outputted to the processor 88 from the operator in response to the user operating the operator, the processor 88 executes the resistance measurement process. During the resistance measurement process, the processor 88 sets the switches 27 to 30 inside the voltage detector 84 in the "off" state (that is, the processor 88 disconnects the high voltage detecting circuit and the A/D converter 85), and sets the switch 31 in the "on" state (that is, the processor 88 connects the low voltage detecting circuit and the A/D converter 85).

In this state, since a measurement current Im is supplied from the current supplier 87 via the current supply line Li to the resistance that is connected across the input terminals 82 and 83 as the measured object, a voltage that is generated across both ends of the resistance due to the measurement current Im is inputted into the input terminals 82 and 83 as the terminal voltage V1. The voltage detector 84 outputs this terminal voltage V1 via the second voltage detecting line Lv2 as the detection voltage V2 to the A/D converter 85 directly (that is, without dividing the voltage). The A/D converter 85 converts the detection voltage V2 to the voltage data Dv and outputs the voltage data Dv. The processor 88 measures (calculates) the terminal voltage V1 based on the voltage data Dv outputted from the A/D converter 85. By also dividing the measured terminal voltage V1 by the (known) current value of the measurement current Im, the processor 88 calculates the resistance value of the measured object and displays the resistance value on the outputter 89.

CITATION LIST

Non Patent Literature

Non Patent Literature 1: "3246 Pencil HiTester" by Yoshiyuki MIYAZAWA, Akihiko MITSUGI, Hideki TOMIYAMA, and Seiji ONUMA in HIOKI GIHOU ("Hioki Technical Notes") Vol. 24 2003 No. 1, available on the Internet (Search date: Jun. 21, 2016) at the URL https://www.hioki.co.jp/jp/support/download3/)

SUMMARY OF INVENTION

Technical Problem

However, with the measuring apparatus 81 described above, the current supplier 87 is constantly connected via the current supply line Li to the input terminal 83 and the output resistance of the current supplier 87 is normally low as described above. Due to this, the inventors of the present application discovered a problem to be solved with the measuring apparatus 81 in that when the pair of input terminals 82 and 83 are connected to a pair of commercial power supply lines and the commercial power supply voltage (a high voltage such as AC 100V) across the commercial power supply lines is measured, a leakage current will flow on a path from the input terminal 83 via the current supply line Li and the current supplier 87 to the internal ground G (that is, the input terminal 82), which may trip an earth leakage breaker installed on the commercial power supply lines.

The present invention was conceived to solve the above problem (or "first problem) and has a principal object of providing a measuring apparatus capable of greatly reducing the current value of a leakage current that flows when measuring a high voltage, such as a commercial power supply voltage.

As this type of measuring apparatus, the inventors of the present application developed a measuring apparatus that is based on the configuration of the measuring apparatus 81 described above but has the following configuration. As depicted by the broken line in FIG. 4, this measuring apparatus has a protective resistor 7 (as one example, a resistor with a high resistance value of 1 MΩ or higher) interposed on the current supply line Li and a switch 8 connected in parallel to the protective resistor 7. The processor 88 compares the terminal voltage V1 calculated from the voltage data Dv with the protective resistor 7 in the interposed state with a reference voltage set in advance and keeps the protective resistor 7 in the interposed state (that is, keeps the switch 8 in the off state) on determining, from the calculated terminal voltage V1 exceeding the reference voltage, that a high voltage such as a commercial power supply voltage is being applied across the input terminals 82 and 83. On the other hand, when the calculated terminal voltage V1 is equal to or below the reference voltage, the processor 88 determines that a high voltage is not being applied across the input terminals 82 and 83 (that is, that the terminal voltage V1 is a low voltage) and ends the state where the protective resistor 7 is interposed (that is, the processor 88 sets the switch 8 in the on state). According to this measuring apparatus, since the current supplier 87 is connected to the input terminal 83 via the protective resistor 7 that has a high resistance value when the terminal voltage V1 is a high voltage that exceeds the reference voltage, it is possible to greatly reduce the current value of the leakage current described above. By doing so, it is possible to prevent a situation where an earth leakage breaker trips.

This measuring apparatus developed by the present inventors also uses the following configuration. In a state where the terminal voltage V1 calculated from the voltage data Dv has been determined to be a low voltage and the interposing of the protective resistor 7 has been removed (that is, the switch 8 has been set in the on state), the processor 88 determines that a resistance is connected between the input terminals 82 and 83 when the terminal voltage V1 is equal to or below a voltage value set in advance and therefore executes a resistance measurement process that measures the resistance value of the resistance based on the voltage value of the terminal voltage V1 and the current value of the measurement current Im supplied to the resistance from the current supplier 87.

Here, the terminal voltage V1 is a voltage generated across both ends of the resistance by the measurement current Im from the current supplier 87 flowing to the resistance, and in the resistance measurement process, the processor 88 compares the terminal voltage V1 calculated from the voltage data Dv with an upper limit threshold (a value such as 1×Dsf, where Dsf is the full scale value of the present measurement range) and a lower limit threshold (k×Dsf, where k is a predetermined value, for example, in a range of 0.09 or below) of the present measurement range. On detecting that the terminal voltage V1 exceeds the upper limit threshold, the processor 88 switches to the next higher resistance measurement range (more specifically, the current value of the measurement current Im is changed (lowered) to a current value corresponding to this higher resistance measurement range). On the other hand, on detecting that the terminal voltage V1 is below the lower limit threshold, the processor 88 switches to the next lower resistance measurement range (more specifically, the current value of the measurement current Im is changed (raised) to a current value corresponding to this lower resistance measurement range).

On detecting that the resistance value calculated by the resistance measurement process exceeds the upper limit threshold of the highest resistance measurement range, the processor 88 determines that there is an open circuit between the input terminals 82 and 83 (a state where a resistance is not connected), and sets the current supply line Li in the state where the protective resistor 7 is interposed (that is, the switch 8 is set in the off state). By using this configuration, even if the operator (the user of this apparatus) ends the resistance measurement and then performs voltage measurement with a high voltage applied across the input terminals 82 and 83, it will be possible for the protective resistor 7 interposed on the current supply line Li to greatly reduce the current value of the resulting leakage current described above, which makes it fundamentally possible to prevent situations where an earth leakage breaker trips.

However, when switching between resistance measurement ranges, both when switching to a higher range and when switching to a lower range, it is common for switching operations that switch from the present resistance measurement range to the next higher resistance measurement range and switch from the present resistance measurement range to the next lower resistance measurement range to be repeatedly performed. The measuring apparatus described above is also configured to execute such common switching operations. This means that with the measuring apparatus described above, when a resistance whose resistance value was being measured is separated from the input terminals 82 and 83, it can take a long time before the resistance measurement range is switched to the highest resistance measurement range by the processor 88 repeating the switching operation described above. In other words, it can take a long time before the switch 8, which was set in the on state during a resistance measurement process, is set in the off state and the protective resistor 7 becomes interposed on the current supply line Li.

Accordingly, in the measuring apparatus developed by the present inventors, if a user connects the input terminals 82 and 83 to a commercial power supply line immediately after completing the measurement of resistance, a situation can occur where a high voltage is applied across the input terminals 82 and 83 before the protective resistor 7 has been interposed on the current supply line Li (that is, before the switch 8 is switched from the on state to the off state). Due to this, there is a problem (or "second problem") to be solved of the risk of a leakage current with a large current value being generated (that is, the risk of an earth leakage breaker tripping).

The present invention was conceived to solve the second problem while solving the first problem described earlier, and it has a principal object of providing a measuring apparatus that is capable of interposing a protective resistor between a current supplier and an input terminal in a shorter time when the input terminals enter an open state during execution of a resistance measurement process.

Solution to Problem

To achieve the stated object, a measuring apparatus according to the present invention comprises: a pair of input terminals; a voltage detector that detects a terminal voltage across the pair of input terminals and outputs a detection voltage in keeping with a voltage value of the terminal voltage; a current supplier capable of supplying a measurement current across the pair of input terminals; and a processor that executes a voltage measurement process, which measures the voltage value based on the detection voltage, and a resistance measurement process, which measures a resistance value that is a measurement target connected between the pair of input terminals based on the voltage value measured by the voltage measurement process when the measurement current is supplied and a current value of the measurement current, wherein a protective resistor is disposed between one input terminal out of the pair of input terminals and the current supplier and a first switch, which is capable of switching to an arbitrary state out of a shorted state and an open state, is connected in parallel to the protective resistor, and the processor executes the voltage measurement process in a state where the first switch has been switched to the open state to measure the voltage value, compares the measured voltage value with a reference voltage value set in advance, and executes the resistance measurement process by setting the first switch in the shorted state when the measured voltage value is equal to or below the reference voltage value.

Also, with the measuring apparatus according to the present invention, in the measuring apparatus described above, the current supplier is configured to be capable of supplying the measurement current with a current value corresponding to one out of a plurality of resistance measurement ranges, and in the resistance measurement process, the processor is operable, when a resistance value measured in a present resistance measurement range is equal to or above a lower limit threshold of the resistance measurement range and equal to or below a first upper limit threshold of the resistance measurement range, to acquire the measured resistance value as the resistance value of the measurement target, operable when the measured resistance value exceeds the first upper limit threshold of the present resistance measurement range and is equal to or below a second upper limit threshold, which is larger than the first upper limit threshold, to switch to a next higher resistance measurement range, and operable when the measured resistance value exceeds the second upper limit threshold of the present resistance measurement range to set the first switch in the open state and end the resistance measurement process.

Also, with the measuring apparatus according to the present invention, the measuring apparatus described above further comprises a display, wherein in the resistance measurement process, the processor is operable, when the measured resistance value exceeds the second upper limit threshold of the present resistance measurement range, to display an indication of out of input range for a highest measurement range out of the plurality of resistance measurement ranges on the display and end the resistance measurement process.

Advantageous Effects of Invention

Since the measuring apparatus according to the present invention is configured so that the current supplier is connected via a protective resistor to the input terminal when the terminal voltage is a high voltage that exceeds the reference voltage, it is possible to greatly reduce the current value of a leakage current that flows into the current supplier, and by doing so, it is possible to prevent a situation where an earth leakage breaker trips.

Also, with the measuring apparatus according to the present invention, even when the user of the measuring apparatus connects the input terminals to a commercial power supply line immediately after resistance measurement has been completed, since a protective resistor is interposed between one of the pair of input terminals and the current supplier in an extremely short time, it is possible to reliably prevent a situation where a leakage current with a large current value is generated due to the application of a commercial power supply voltage (a high voltage such as 100 V AC) to the input terminals (that is, a situation where the earth leakage breaker trips due to this).

Also, with the measuring apparatus according to the present invention, since an indication of out of input range is displayed (as one example, "out of input range" is displayed) in a state after switching to a display content of the highest resistance measurement range out of the plurality of resistance measurement ranges, the displayed "out of input range" can clearly inform the operator that the upper limit value of the resistance measurement range of the measuring apparatus has been exceeded.

DESCRIPTION OF EMBODIMENTS

Preferred embodiments of a measuring apparatus will now be described with reference to the attached drawings.

First, the configuration of a measuring apparatus 1 will be described with reference to the drawings as an example of a "measuring apparatus".

Figure 1:
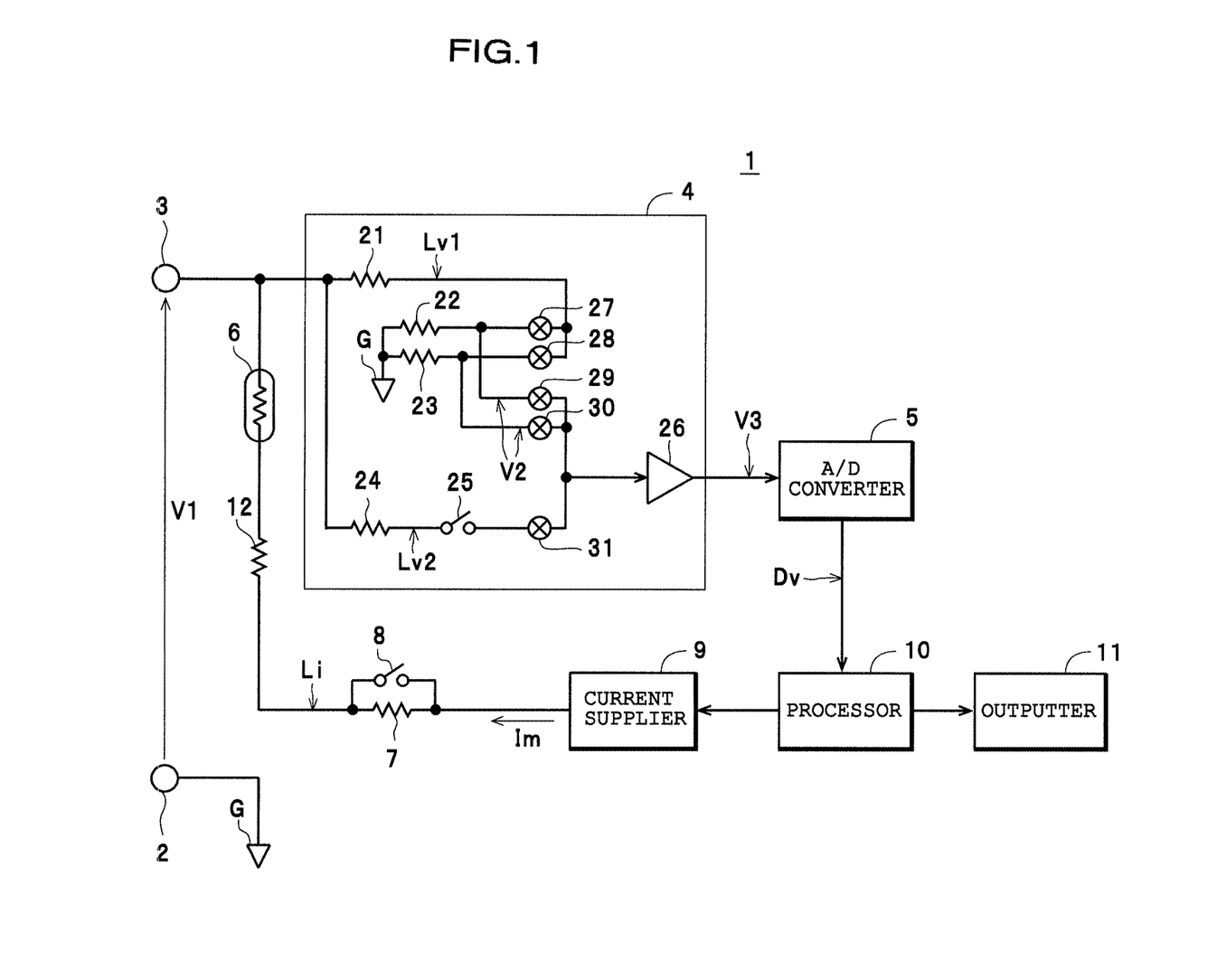
FIG. 1 is a diagram depicting the configuration of a measuring apparatus 1.

As depicted in FIG. 1, the measuring apparatus 1 includes a pair of input terminals 2 and 3, a voltage detector 4, an A/D converter 5, a thermistor 6, protective resistors 7 and 12, a first switch 8, a current supplier 9, a processor 10, and an outputter 11. One out of the input terminals 2 and 3 (in the present embodiment, the input terminal 2) is connected to a reference potential (the "internal ground G") inside the apparatus and functions as a COM terminal, and the other terminal (in the present embodiment, the input terminal 3) serves as both a voltage measuring terminal and a resistance measuring terminal.

The measuring apparatus 1 is capable of automatic measurement, that is, is configured to automatically determine whether an AC voltage (a sinusoidal voltage: "E×sin Ωt") is being inputted across the input terminals 2 and 3, whether a DC voltage is being inputted, whether a resistance as an object to be measured has been connected, whether a diode as an object to be measured has been connected, and to measure a voltage value on determining that an AC voltage is being inputted, to measure a voltage value on determining that a DC voltage is being inputted, to measure a resistance value R on determining that a resistance has been connected, to measure the forward voltage on determining that a diode has been connected in a forward state (a state where the cathode terminal is connected to the input terminal 2 and the anode terminal is connected to the input terminal 3), and to output the respective measurement values to the outputter 11.

In one example specification for the measuring apparatus 1, it is assumed that an upper voltage measurement range covers a measured voltage range of ±600.0 V DC for DC voltages and 600.0 V AC or below for AC voltages, a middle voltage measurement range covers a measured voltage range of ±60.00 V DC for DC voltages and 60.00 V AC or below for AC voltages, and a lower voltage measurement range covers a measured voltage range of ±6.000 V DC (excluding a range of 0 V or higher but below +3.000 V) for DC voltages and a range of 6.000 V AC or below for AC voltages.

It is also assumed that as one example, the resistance measurement range is composed of six resistance measurement ranges that are a first resistance measurement range with an upper limit value of 600.0Ω (full scale) (the lowest resistance measurement range covering a measured resistance range of 0Ω to 600.0Ω), a second resistance measurement range with an upper limit value of 6.000 kΩ (covering a measured resistance range of 0Ω to 6.000Ω), a third resistance measurement range with an upper limit value of 60.00 kΩ (covering a measured resistance range of 0Ω to 60.00 kΩ), a fourth resistance measurement range with an upper limit value of 600.0 kΩ (covering a measured resistance range of 0Ω to 600.0 kΩ), a fifth resistance measurement range with an upper limit value of 6.000 MΩ (covering a measured resistance range of 0Ω to 6.000 MΩ), and a sixth resistance measurement range with an upper limit value of 60.00 MΩ (covering a measured resistance range of 0Ω to 60.00 MΩ).

For the first resistance measurement range that is the lowest resistance measurement range, the upper limit value (600Ω) of the resistance measurement range is defined as a first upper limit threshold RH1, and a resistance value (as one example in the present embodiment, 720Ω) that is higher than this first upper limit threshold RH1 is also defined as a second upper limit threshold RH2. For the second resistance measurement range, a predetermined value that is 9% or lower than the upper limit value (6 kΩ) of this resistance measurement range is defined as a lower limit threshold RL (as one example in the present embodiment, 540Ω corresponding to 9%), the upper limit value (6 kΩ) of this resistance measurement range is defined as the first upper limit threshold RH1, and a larger resistance value than the first upper limit threshold RH1 (as one example in the present embodiment, 7.2 kΩ) is set as the second upper limit threshold RH2. The same settings as the second resistance measurement range described above are also made for the third resistance measurement range to the sixth resistance measurement range, so that a lower limit threshold RL (5.4 kΩ), a first upper limit threshold RH1 (60 kΩ), and a second upper limit threshold RH2 (72 kΩ) are set for the third resistance measurement range (with the upper limit value of 60 kΩ), a lower limit threshold RL (54 kΩ), a first upper limit threshold RH1 (600 kΩ), and a second upper limit threshold RH2 (720 kΩ) are set for the fourth resistance measurement range (with the upper limit value of 600 kΩ), a lower limit threshold RL (540 kΩ), a first upper limit threshold RH1 (6 MΩ), and a second upper limit threshold RH2 (7.2 MΩ) are set for the fifth resistance measurement range (with the upper limit value of 6 MΩ), and a lower limit threshold RL (5.4 MΩ), a first upper limit threshold RH1 (60 MΩ), and a second upper limit threshold RH2 (72 MΩ) are set for the sixth resistance measurement range (with the upper limit value of 60 MΩ).

Regarding diodes, to make it possible to measure the forward voltage of a variety of diodes such as a Schottky barrier diode with a forward voltage of around 0.35V, a general-purpose diode with a forward voltage of around 0.6V, a switching diode with a forward voltage of around 1.2V, and a light-emitting diode with a forward voltage of around 2V, when a measured voltage (DC voltage) in the lower voltage measurement range is included in a range of voltages that exceeds +0.3 V DC but is below +3 V DC (this range is referred to below as the "forward voltage range"), it is assumed that a diode has been connected in the forward direction and the measured DC voltage is outputted as a forward voltage.

In the measuring apparatus 1, the respective component elements are configured as in the following example to satisfy the specification described above.

The voltage detector 4 detects the terminal voltage V1 across the input terminals 2 and 3 (that is, the voltage generated at the input terminal 3 with the input terminal 2 as the reference potential), and outputs a detection voltage V3, described later, with a voltage value corresponding to the voltage value of the terminal voltage V1. As an example, the voltage detector 4 includes an input resistor 21 interposed on a first voltage detecting line (or "first detecting path") Lv1, a plurality of voltage-dividing (or "range") resistors connected to the first voltage detecting line Lv1 (as one example in the present embodiment, two voltage-dividing resistors 22 and 23 that respectively construct voltage dividing circuits together with the input resistor 21), an input resistor 24 and a second switch 25 that are interposed on a second voltage detecting line (or "second detecting path") Lv2, a buffer (or amplifier) 26, two switches 27 and 28 for selectively connecting an arbitrary resistor out of the plurality of voltage-dividing resistors (in the present embodiment, the two voltage-dividing resistors 22 and 23 mentioned above) to the first voltage detecting line Lv1, two switches 29 and 30 for selectively connecting a junction between the selectively connected voltage-dividing resistor and the input resistor 21 to an input terminal of the buffer 26, and a switch 31 for connecting the second voltage detecting line Lv2 to the input terminal of the buffer 26. Here, the input resistor 21, the voltage-dividing resistors 22 and 23, and the switches 27 to 30 construct a high voltage detecting circuit for dividing and outputting the terminal voltage V1, and the input resistor 24, the second switch 25, and the switch 31 construct a low voltage detecting circuit that outputs the terminal voltage V1 as it is without dividing.

Here, the resistance values of the input resistors 21 and 24 are set values (as one example, resistance values of 1 MΩ) or higher) which, in a state where a voltage whose absolute value is the maximum in the upper measurement range for measuring a high voltage (as examples, a commercial power supply voltage (100 V AC (with an amplitude of 141 V) in Japan or 230 V AC (with an amplitude of 325 V) in Europe and North America) is inputted to (applied across) the input terminals 2 and 3, are capable of suppressing the leakage current that flows into the measuring apparatus 1 to below an operating current (or "sensitivity current", as one example around 30 mA) of an earth leakage breaker installed on a commercial power supply line.

One end of the input resistor 21 is connected to the input terminal 3, and the other end is connected via the switch 27 to one end of the voltage-dividing resistor 22 and is also connected via the switch 28 to one end of the voltage-dividing resistor 23. The other ends of the voltage-dividing resistors 22 and 23 are connected to the internal ground G. With this configuration, the input resistor 21 functions in combination with the selected voltage-dividing resistor out of the voltage-dividing resistors 22 and 23 (that is, the voltage-dividing resistor connected to the switch out of the switches 27 and 28 that has been set in the "on" state) as voltage-dividing resistors for dividing the terminal voltage V1 to generate the divided voltage V2. As one example in the present embodiment, the input resistor 21 is set at 10 MΩ). The junction between the voltage-dividing resistor 22 and the switch 27 is connected via the switch 29 to the input terminal of the buffer 26 and the junction of the voltage-dividing resistor 23 and the switch 28 is also connected via the switch 30 to the input terminal of the buffer 26. The input resistor 24 is set at several MΩ, for example (as one example in the present embodiment, 1 MΩ). Note that the resistance values of the input resistors 21 and 24 are not limited to these examples and can be set to arbitrary values so long as the condition described above relating to the leakage current is satisfied.

The voltage-dividing resistor 22 is used in the upper measurement range, and with consideration to the input rating (as one example, from −10 V to +10 V) of the A/D converter 5 described later, is set for example at 100 kΩ so that the divided voltage V2 described above becomes (+10 V, −10 V) when the terminal voltage V1 is inputted with a voltage value (+1000 V, −1000 V) whose absolute value is the maximum for the upper measurement range (that is, so as to produce a dividing ratio 1/100 for the input resistor 21 and the voltage-dividing resistor 22). The voltage-dividing resistor 23 is used in the middle measurement range, and with consideration to the input rating of the A/D converter 5, is set at 1 MΩ for example so that the divided voltage V2 described above becomes (+10V, −10V) when the terminal voltage V1 is inputted with voltage values (+100V, −100V) whose absolute value is the maximum for the middle measurement range (that is, so as to produce a dividing ratio 1/10 for the input resistor 21 and the voltage-dividing resistor 23).

One end of the input resistor 24 is connected to the input terminal 3 and the other end is connected to one end of the second switch 25. The other end of the second switch 25 is connected via the switch 31 to the input terminal of the buffer 26. This means that the input resistor 24 and the second switch 25 are interposed on the second voltage detecting line Lv2 in a state where the input resistor 24 and the second switch 25 are connected in series. With this configuration, when the switches 25 and 31 are in the on state, the second voltage detecting line Lv2 outputs the terminal voltage V1 as it is (with a dividing ratio of 1) to the input terminal of the buffer 26. The switch 31 selectively connects the second voltage detecting line Lv2 to the input terminal of the buffer 26. In this configuration, the second switch 25 is composed of a switch with a high withstand voltage (as examples, a high-withstand-voltage photoMOS relay or a mechanical relay). As one example in the present embodiment, each of the switches 27 to 31 is constructed of a semiconductor relay or a semiconductor switch. Note that with the configuration described above, the switch 31 is connected in series to the second switch 25 that is interposed on the second voltage detecting line Lv2. This means that the switch 31 may be omitted and the second switch 25 may be directly connected to the input terminal of the buffer 26.

The buffer 26 inputs, in a state where the input impedance is high, one of the divided voltage V2, which is outputted from one of the switches 29 and 30 connected to the voltage-dividing resistors 22 and 23 connected to the first voltage detecting line Lv1, and the terminal voltage V1, which is outputted from the switch 31 connected to the second voltage detecting line Lv2, and outputs the inputted voltage as the detection voltage V3 to the A/D converter 5. Note that an input amplifier, described later, is disposed inside the A/D converter 5 and that the buffer 26 may be omitted when the input impedance of the input amplifier is high.

The A/D converter 5 is equipped for example with an input amplifier and an A/D converter (not illustrated), inputs the detection voltage V3 as an analog signal with a voltage value within the input rating (from −10V to +10V), converts the detection voltage V3 into voltage data Dv indicating momentary values of the detection voltage V3 by sampling at a predetermined sampling cycle set in advance, and outputs the voltage data Dv to the processor 10.

The thermistor 6, the protective resistors 7 and 12, and the first switch 8 are interposed on the current supply line Li from the input terminal 3 to the output terminal of the current supplier 9. In more detail, the thermistor 6 is constructed using a PTC thermistor (Positive Temperature Coefficient thermistor) for example, and has one end connected to the input terminal 3. One protective resistor 12 is set for example at several kΩ) (as one example in the present embodiment, 1 kΩ), and has one end connected to the other end of the thermistor 6. The other protective resistor 7 is set for example at several MΩ (as one example in the present embodiment, 1.5 MΩ), has one end connected to the other end of the protective resistor 12, and has another end connected to the output terminal of the current supplier 9. The first switch 8 is constructed of a switch with a high withstand voltage like the second switch 25, and is connected in parallel to the protective resistor 7.

With this configuration, when the terminal voltage V1 across the input terminals 2 and 3 is a high voltage, by setting the first switch 8 in the off state (open state) as described later on the current supply line Li, it is possible to use the protective resistor 7 that has a high resistance value to limit the current value of the current (leakage current) that flows from the input terminal 3 into the current supplier 9, which normally has a low output impedance, to a sufficiently low value. Also, on the current supply line Li, although the first switch 8 is switched to the on state (a shorted state) as described later when the terminal voltage V1 across the input terminals 2 and 3 is a low voltage, even if a high voltage is temporarily applied from the input terminal 3 in this state, the thermistor 6 will instantaneously generate heat, raising its resistance value, which avoids having an overcurrent flowing into the current supplier 9 (that is, avoids damage to the current supplier 9 due to an overcurrent). Also, even if a low voltage of around 10 V for example is applied across the input terminals 2 and 3 when the first switch 8 is in the on state, it is possible for the protective resistor 12 to limit the current value of the current flowing into the current supplier 9 to around 10 mA (that is, a current value that is below the sensitivity current described above).

Although not illustrated, it is also possible to use a configuration where a protective diode is connected to the current supply line Li. The protective diode clamps the voltage applied from the input terminal 3 to the current supply line Li to the internal ground G or a power supply voltage generated by a power supply, not illustrated, inside the apparatus with the internal ground G as a reference (i.e., an operating voltage for component elements inside the apparatus, such as the A/D converter 5, the current supplier 9, and the processor 10).

The current supplier 9 is configured to generate an output voltage that has the internal ground G as a reference at the output terminal so as to supply the measurement current (or "constant DC current") Im from the output terminal to the current supply line Li with a constant current value indicated by the processor 10. In the present embodiment, as described earlier, there are six resistance measurement ranges that are a first resistance measurement range with an upper limit value (full scale) of 600.0Ω, a second resistance measurement range with an upper limit value of 6.000 kΩ, a third resistance measurement range with an upper limit value of 60.00 kΩ, a fourth resistance measurement range with an upper limit value of 600.0 kΩ, a fifth resistance measurement range with an upper limit value of 6.000 MΩ, and a sixth resistance measurement range with an upper limit value of 60.00 MΩ. For this reason, the current supplier 9 is capable of supplying the measurement current Im with a current value corresponding to a plurality of resistance measurement ranges (in the present embodiment, six ranges as described above), that is, supplying the measurement current Im with a constant current value of 0.5 mA corresponding to the first resistance measurement range, a constant current value of 50 µA corresponding to the second resistance measurement range, a constant current value of 5 µA corresponding to the third resistance measurement range, a constant current value of 0.5 µA corresponding to the fourth resistance measurement range, a constant current value of 50 nA corresponding to the fifth resistance measurement range, and a constant current value of 5 nA corresponding to the sixth resistance measurement range.

Although the current supplier 9 controls the voltage value of the output voltage so that the current value of the measurement current Im is constant in keeping with the magnitude (resistance value) of the load between the internal ground G and the output terminal, the upper limit of the voltage value is set at an upper limit voltage value set in advance (for example, 2.8 V DC, that is, a voltage capable of turning on a diode connected in the forward direction). Also, in the present embodiment, it is assumed that when the measuring apparatus 1 is active, the current supplier 9 continuously executes an operation of supplying the measurement current Im with a current value designated from the processor 10.

Figure 2:
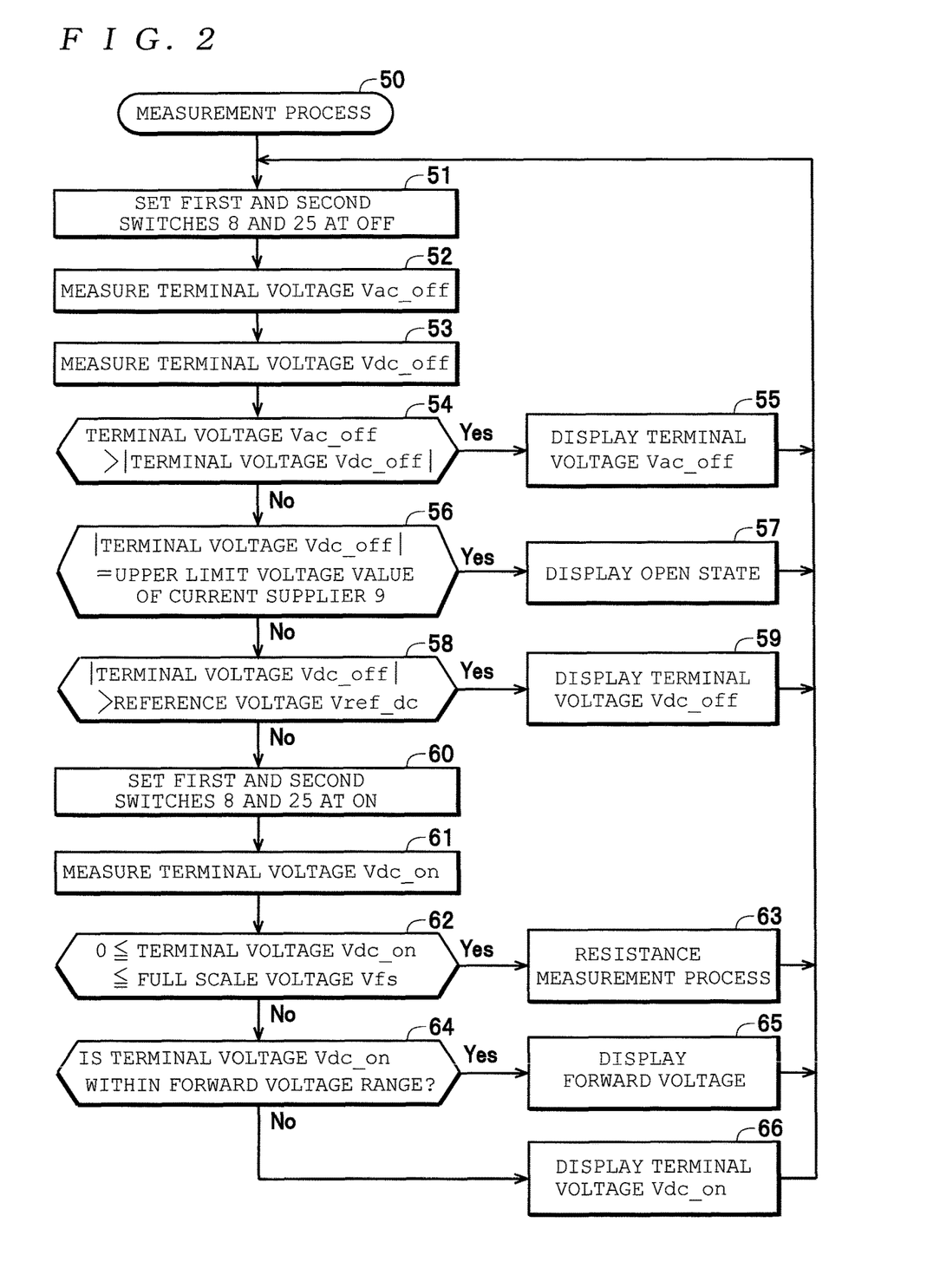
FIG. 2 is a flowchart useful in explaining the operation of the measuring apparatus 1.

The processor 10 is composed of a computer for example, and executes a measurement process 50 depicted in FIG. 2. In a voltage measurement process executed in this measurement process 50, the processor 10 measures (calculates) the terminal voltage V1 based on the voltage data Dv outputted from the A/D converter 5, the voltage dividing ratio (one of "1/100", "1/10", and "1") on the voltage detecting line used when acquiring the voltage data Dv out of the voltage detecting lines Lv1 and Lv2, and the amplification factor at the buffer 26 and the A/D converter 5.

In the resistance measurement process executed in the measurement process 50, the processor 10 measures (calculates) the terminal voltage V1 based on the voltage data Dv outputted from the A/D converter 5, the voltage dividing ratio (1) on the second voltage detecting line Lv2 used in this resistance measurement process, and the amplification factor of the buffer 26 and the A/D converter 5, and measures (calculates) the resistance value R of the resistance connected across the input terminals 2 and 3 based on the measured terminal voltage V1 and the current value of the measurement current Im (that is, the current value indicated to the current supplier 9). Also in this resistance measurement process, the processor 10 compares the measured resistance value R with the lower limit threshold RL, the first upper limit threshold RH1, and the second upper limit threshold RH2 of the present resistance measurement range to decide the appropriate resistance measurement range, and executes an operation of instructing the current supplier 9 to output the measurement current Im with a current value corresponding to the decided resistance measurement range.

In the measurement process 50, the processor 10 determines, based on the measured terminal voltage V1, whether the input terminals 2 and 3 are in an open state, whether a resistance is connected, or whether a diode has been connected in the forward direction. When the terminals are in the open state, an indication to that effect is displayed on the outputter 11. When a resistance is present, the resistance measurement process is executed and the resistance value R is displayed on the outputter 11, and when a diode is present, the forward voltage is measured and displayed on the outputter 11. The processor 10 also executes on/off control of the first switch 8, the second switch 25, and the switches 27 to 31. Note that although a configuration where the A/D converter 5 is disposed outside the processor 10 is used in the present embodiment, it is also possible to use a configuration where the A/D converter 5 is disposed inside the processor 10 (that is, a configuration where the A/D converter 5 and the processor 10 form a processor). The processor in this configuration directly inputs the detection voltage V3, executes the voltage measurement process that measures the terminal voltage V1 based on this detection voltage V3, and executes the resistance measurement process based on the terminal voltage V1, which is based on the detection voltage V3 when the measurement current Im is supplied, and on the current value of the measurement current Im.

As an example, the outputter 11 is constructed of a display device such as an LCD, and displays the measurement result (that is, the voltage value or resistance value R that has been measured) produced by the measurement process executed by the processor 10 on a screen. It should be noted that it is also possible to use a configuration where in place of a display device, the outputter 11 is constructed of various types of interface circuit, for example, a network interface circuit, and transmits the measurement result to an external device via a network.

Next, the operation of the measuring apparatus 1 will be described.

In the measuring apparatus 1, in the active state, the A/D converter 5 executes a sampling operation and the processor 10 repeatedly executes the measurement process 50.

In the measurement process 50, the processor 10 first sets the first switch 8 and the second switch 25 in the off state (step 51). In step 51, the processor 10 indicates the current value (5 nA) corresponding to the sixth resistance measurement range, which is the highest, to the current supplier 9. As a result, the current supplier 9 executes the supplying of a measurement current Im at this current value (5 nA).

Next, the processor 10 measures and stores the effective value of the terminal voltage V1 in this state as the terminal voltage Vac_off (step 52) and measures and stores an average value of the terminal voltage V1 as the terminal voltage Vdc_off (step 53). When measuring the terminal voltage Vac_off and the terminal voltage Vdc_off, the processor 10 acquires the voltage data Dv outputted from the A/D converter 5 for a predetermined period (as one example, when the terminal voltage V1 is an AC voltage, a period that is one or more cycles of the AC voltage), and calculates (measures) the terminal voltage Vac_off and the terminal voltage Vdc_off based on the voltage data Dv in one cycle or a plurality of cycles. In addition, based on the terminal voltage Vac_off and the terminal voltage Vdc_off that have been calculated, the processor 10 selects a preferable measurement range out of the upper measurement range (where the switches 27 and 29 are turned on, the switches 28 and 30 are turned off, and measurement is performed using the voltage-dividing resistor 22) and the middle measurement range (where the switches 27 and 29 are turned off, the switches 28 and 30 are turned on, and measurement is performed using the voltage-dividing resistor 23), and calculates (measures) the final terminal voltage Vac_off and the terminal voltage Vdc_off.

Next, the processor 10 compares the terminal voltage Vac_off and the terminal voltage Vdc_off that have been measured and determines whether the terminal voltage Vac_off exceeds the absolute value of the terminal voltage Vdc_off (step 54). Here, although the processor 10 measures the terminal voltage Vac_off and the terminal voltage Vdc_off with an AC voltage as the terminal voltage V1 when an AC voltage is inputted from outside across the input terminals 2 and 3, the terminal voltage Vac_off (=E/√2) that is the voltage value of the AC voltage is measured as a value that is 1.11 times the absolute value of the terminal voltage Vdc_off (=2×E/π). Also, although the processor 10 measures the terminal voltage Vac_off and the terminal voltage Vdc_off with a DC voltage as the terminal voltage V1 when a DC voltage is inputted across the input terminals 2 and 3 from outside, the terminal voltage Vac_off is measured as the same value as the absolute value of the terminal voltage Vdc_off, which is the voltage value of the direct current voltage.

Also, when neither an AC voltage nor a DC voltage has inputted from outside across the input terminals 2 and 3 and neither a resistor nor a diode is connected between the input terminals 2 and 3 (that is, the input terminals 2 and 3 are in the open state) or a diode is connected but in a reverse state (that is, a state in which an anode terminal is connected to the input terminal 2 and a cathode terminal is connected to the input terminal 3), the voltage of the input terminal 3 is set at the upper limit voltage value of the current supplier 9 (in the present embodiment, 2.8 V DC) with the potential of the input terminal 2 as a reference. For this reason, although the processor 10 will measure the terminal voltage Vac_off and the terminal voltage Vdc_off with this upper limit voltage value, which is a DC voltage, as the terminal voltage V1, the terminal voltage Vac_off is measured as the same value as the absolute value of the terminal voltage Vdc_off that indicates the upper limit voltage value (2.8 V DC).

When neither an AC voltage nor a DC voltage is inputted across the input terminals 2 and 3 from outside and a diode is connected in the forward direction between the input terminals 2 and 3, the voltage of the input terminal 3 is set at the forward voltage of the diode with the potential of the input terminal 2 as a reference (around 0.35 V DC for a Schottky barrier diode, around 0.6 V DC for a general-purpose diode, around 1.2 V DC for a switching diode, and around 2 V DC for a light emitting diode). For this reason, although the processor 10 will measure the terminal voltage Vac_off and the terminal voltage Vdc_off with the forward voltage that is a DC voltage as the terminal voltage V1, the terminal voltage Vac_off is measured as the same value as the absolute value of the terminal voltage Vdc_off indicating the forward voltage.

Accordingly, the processor 10 determines that an AC voltage is being inputted across the input terminals 2 and 3 only after determining that the terminal voltage Vac_off exceeds the terminal voltage Vdc_off in step 54, and displays the measured terminal voltage Vac_off on the outputter 11 as the voltage value of an AC voltage (step 55), before the processing returns to step 51.

On the other hand, when it has been determined in step 54 that the terminal voltage Vac_off does not exceed the absolute value of the terminal voltage Vdc_off (that is, when a DC voltage is being inputted across the input terminals 2 and 3, when a resistance or a diode is connected, or when nothing is connected (the "open state")), the processor 10 then determines whether the absolute value of the terminal voltage Vdc_off matches the upper limit voltage value (2.8 V DC) of the current supplier 9 (for example, whether the absolute value is included in a voltage range (or "upper limit voltage range") of ±several percent centered on 2.8 V DC) (step 56). In this case, as described above, when the absolute value of the terminal voltage Vdc_off has been measured as the same value as the upper limit voltage value (in the present embodiment, 2.8 V DC) of the current supplier 9, this indicates that neither a resistance nor a diode is connected between the input terminals 2 and 3 (that is, the input terminals 2 and 3 are in the open state), or a state where a diode is connected but in the reverse direction (that is, the anode terminal is connected to the input terminal 2 and the cathode terminal is connected to the input terminal 3).

For this reason, in step 56, on determining that the absolute value of the terminal voltage Vdc_off is equal to the upper limit voltage value (2.8 V DC) of the current supplier 9, the processor 10 determines that the input terminals 2 and 3 are in an open state or a diode has been connected in a reverse direction and displays information indicating that the input terminals 2 and 3 are in an "open state" (a state which here includes a state where a diode has been connected in the reverse direction) on the outputter 11 (step 57), before the processing returns to step 51.

On the other hand, on determining in step 56 that the absolute value of the terminal voltage Vdc_off does not match the upper limit voltage value (2.8 V DC) of the current supplier 9 (that is, when a DC voltage is being inputted across the input terminals 2 and 3, when a resistance is connected, or when a diode has been connected in the forward direction), the processor 10 then determines whether the absolute value of the terminal voltage Vdc_off exceeds a reference voltage value Vref_dc set in advance (step 58). In the present embodiment, the reference voltage value Vref_dc is set at an absolute value of the upper limit value and the lower limit value (in the present embodiment, 6.000 V) of the range of measured voltages for DC voltages in the lower voltage measurement range.

Here, the absolute value of the terminal voltage Vdc_off exceeds the reference voltage value Vref_dc only when a DC voltage exceeding the absolute value of 6 V has been inputted across the input terminals 2 and 3 and when an AC voltage with an amplitude of 9.42 V has been inputted across the input terminals 2 and 3. Since the processing proceeds to the processing in step 55 when an AC voltage is being inputted due to the determination in step 54, the absolute value of the voltage Vdc_off will exceed the reference voltage value Vref_dc in step 58 only when a DC voltage with an absolute value that exceeds 6 V has been inputted across the input terminals 2 and 3. For this reason, on determining that the absolute value of the terminal voltage Vdc_off exceeds the reference voltage value Vref_dc, the processor 10 determines that a DC voltage whose absolute value exceeds 6 V is being inputted across the input terminals 2 and 3 and displays the measured terminal voltage Vdc_off on the outputter 11 as the voltage value of a DC voltage (as one example, a voltage value with a + sign when the polarity is positive and a voltage value with a − sign when the polarity is negative) (step 59), before the processing returns to step 51. It should be noted that in place of this configuration where the processing in each of steps 58 and 59 are executed after the processing in steps 56 and 57, it is also possible to use a configuration where steps 58 and 59 are executed before the processing of steps 56 and 57.

On the other hand, on determining in step 58 that the absolute value of the terminal voltage Vdc_off does not exceed the reference voltage value Vref_dc (that is, the terminal voltage V1 generated between the input terminals 2 and 3 is a low voltage (a DC voltage whose absolute value is equal to or below the reference voltage value Vref_dc (in the present embodiment, 6 V)), the processor 10 switches the first switch 8 and the second switch 25 from the off state to the on state (step 60). In addition, since the second switch 25 switching to the on state switches the voltage detecting line in use from the voltage detecting line Lv1 to the voltage detecting line Lv2 (or in other words, sets the lower measurement range as valid), the switches 27 to 30 out of the switches 27 to 31 for selecting the measurement range are set in the off state and the switch 31 is set in the on state.

Note that although both ends of the protective resistor 7 (1.5 MΩ) are shorted by the first switch 8 that has been set in the on state, since there is another protective resistor 12 interposed between the output terminal of the current supplier 9 that has a low output impedance and the input terminal 3, a current (leakage current) flowing from the input terminal 3 into the output terminal of the current supplier 9 is suppressed by the protective resistor 12 to below the sensitivity current of the breaker.

Next, the processor 10 measures and stores the average value of the terminal voltage V1 in this state as the terminal voltage Vdc_on in the same manner as when measuring the terminal voltage Vdc_off described above (step 61).

The processor 10 next determines whether the measured terminal voltage Vdc_on is equal to or below the full scale voltage Vfs of the present resistance measurement range (step 62). Here, it is assumed that the expression "full-scale voltage Vfs" of a resistance measurement range is the voltage (the "terminal voltage V1") generated across both ends of a resistance when a resistance with a resistance value R that is equal to an upper limit value (or "full scale") of the range of measured resistances in the resistance measurement range is connected between the input terminals 2 and 3 and a measurement current Im, which is set at a current value of the resistance measurement range and is supplied from the current supplier 9, flows to the resistance.

In the present embodiment, as described above, the resistance measurement range is one of six resistance measurement ranges that are the first resistance measurement range (upper limit value: 600.0Ω), the second resistance measurement range (upper limit value: 6.000 kΩ), the third resistance measurement range (upper limit value: 60.00 kΩ), the fourth resistance measurement range (upper limit value: 600.0 kΩ), the fifth resistance measurement range (upper limit value: 6.000 MΩ), and the sixth resistance measurement range (upper limit value: 60.00 MΩ). For the first resistance measurement range, the processor 10 indicates 0.5 mA corresponding to this measurement range to the current supplier 9, for the second resistance measurement range, the processor 10 indicates 50 µA corresponding to this measurement range to the current supplier 9, for the third resistance measurement range, the processor 10 indicates 5 µA corresponding to this measurement range to the current supplier 9, for the fourth resistance measurement range, the processor 10 indicates 0.5 µA corresponding to this measurement range to the current supplier 9, for the fifth resistance measurement range, the processor 10 indicates 50 nA corresponding to this measurement range to the current supplier 9, and for the sixth resistance measurement range, the processor 10 indicates 5 nA corresponding to this measurement range to the current supplier 9, so that the full scale voltage Vfs is +0.3 V DC in each of the resistance measurement ranges (when the first resistance measurement range is given as an example, 600 Ω×0.5 mA=0.3 V).

On determining in step 62 that the terminal voltage Vdc_on is equal to or above 0 V DC and equal to or below the full-scale voltage Vfs (+0.3 V DC), the processor 10 determines that a resistance (that is, a resistance with a resistance value R that is equal to or below the upper limit value of the resistance measurement range) is connected between the input terminals 2 and 3 and executes the resistance measurement process 63 (step 63).

Figure 3:
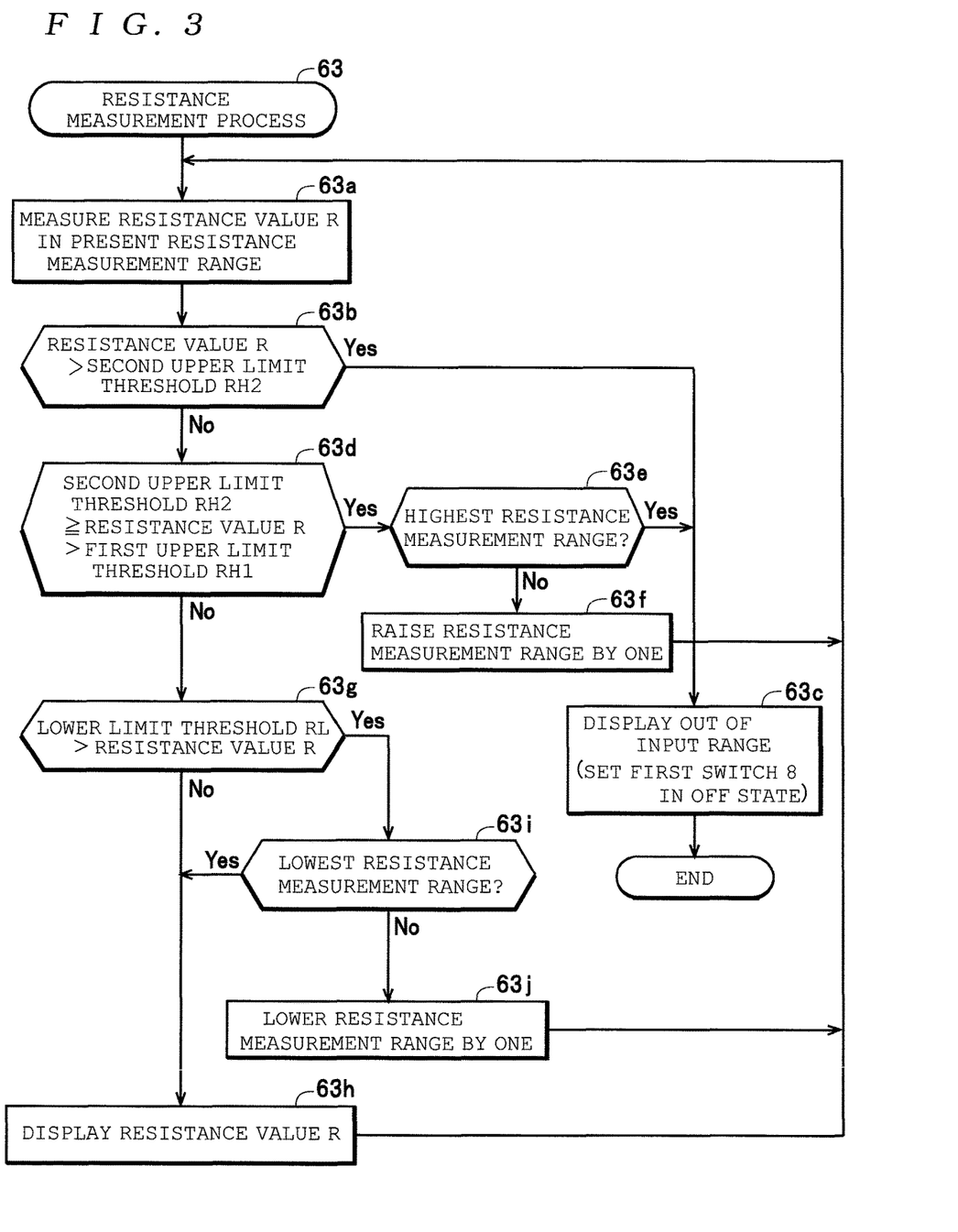
FIG. 3 is a flowchart that is useful in explaining the operation of a resistance measurement process 63 in FIG. 2.

In this resistance measurement process 63, as depicted in FIG. 3, the processor 10 first measures (calculates) the resistance value R in the present resistance measurement range (step 63a). Next, the processor 10 determines whether the resistance value R exceeds the second upper limit threshold RH2 of the present resistance measurement range (step 63b). On determining that the resistance value R exceeds the second upper limit threshold RH2, the processor 10 switches the display content of the outputter 11 to the display content for the sixth resistance measurement range that is the highest (as one example, characters ("MΩ") indicating the units of the sixth resistance measurement range are displayed) and displays an indication of out of input range on the outputter 11 (as one example, the characters "out of input range" are displayed) (step 63c). In addition, in this step 63c, the processor 10 sets the first switch 8 in the off state and ends the resistance measurement process 63. When the resistance measurement process 63 has ended, the processor 10 returns to step 51 of the measurement process 50.

On determining, as a result of the determination in step 63b described above, that the resistance value R does not exceed the second upper limit threshold RH2 (that is, the resistance value R is equal to or below the second upper limit threshold RH2), the processor 10 determines whether the resistance value R is within a range that exceeds the first upper limit threshold RH1 and is equal to or below the second upper limit threshold RH2 (step 63d). When the resistance value is within this range, the processor 10 then determines whether the present resistance measurement range is the highest resistance measurement range (step 63e). When, as a result of the determination in step 63e, the processor 10 has determined that the present resistance measurement range is the highest resistance measurement range, the processor 10 ends the resistance measurement process after executing the processing in step 63c described above, and the processing then returns to step 51.

On the other hand, when as a result of the determination in step 63e, it has been determined that the present resistance measurement range is not the highest resistance measurement range (that is, a resistance measurement range that is higher than the present resistance measurement range exists), the processor 10 executes a process of raising the resistance measurement range from the present resistance measurement range to the next higher resistance measurement range (step 63f), and the processing then returns to step 63a described above. In the process of raising to the next higher resistance measurement range, the processor 10 indicates the current value corresponding to the resistance measurement range that is the next higher resistance measurement range to the current supplier 9 so that the current supplier 9 executes the supplying of the measurement current Im at the indicated current value.

On determining, as a result of the determination in step 63d described above, that the resistance value R is not within a range that exceeds the first upper limit threshold RH1 and is equal to or below the second upper limit threshold RH2, the processor 10 then determines whether the resistance value R is below the lower limit threshold RL (step 63g). When, as a result of this determination, it is determined that the resistance value R is not below the lower limit threshold RL (that is, the resistance value R is equal to or above the lower limit threshold RL), the processor 10 switches the display content of the outputter 11 to the display content for the present resistance measurement range (as one example, characters indicating the unit of the present resistance measurement range are displayed), and displays the resistance value R on the outputter 11 (step 63h), before the processing returns to step 63a.

On the other hand, when, as a result of the determination in step 63g described above, it has been determined that the resistance value R is lower than the lower limit threshold RL, the processor 10 determines whether the present resistance measurement range is the lowest resistance measurement range (step 63i). When, as a result of the determination in step 63i, it has been determined that the present resistance measurement range is the lowest resistance measurement range, the processor 10 executes the processing in step 63h described above and the processing returns to step 63a. When, as a result of the determination in step 63i, it has been determined that the present resistance measurement range is not the lowest resistance measurement range (that is, a resistance measurement range on the lower side of the present resistance measurement range exists), the processor 10 executes a process of lowering the resistance measurement range from the present resistance measurement range to the next lower resistance measurement range (step 63j), and the processing returns to step 63a described above. In the process of lowering to the next lower resistance measurement range, the processor 10 indicates the current value corresponding to the resistance measurement range that is this lower resistance measurement range to the current supplier 9 so that the current supplier 9 executes the supplying of the measurement current Im at the indicated current value.

By doing so, when a resistance is connected between the input terminals 2 and 3, the processor 10 executes the resistance measurement process 63 described above with the sixth resistance measurement range as the resistance measurement range at the start, and when the resistance value R measured in step 63a is within a range that is equal to or above the lower limit threshold RL and is equal to or below the first upper limit threshold RH1 of the sixth resistance measurement range (that is, when the sixth resistance measurement range is a resistance measurement range that is suited to measuring the present resistance value R (also referred to as the "appropriate resistance measurement range")), the resistance value R is displayed as the resistance value R of the resistance in the processing in step 63h executed via the determination processing in step 63b, step 63d, and step 63g.

When the resistance value R measured in step 63a exceeds the first upper limit threshold RH1 of the sixth resistance measurement range, in the processing in step 63c that is executed via the determination processing in step 63b or the determination processing in steps 63b, 63d, and 63e, the characters "out of input range" are displayed indicating that the resistance value R of the resistance exceeds the resistance measurement range (a range of 0Ω to 60 MΩ, inclusive) of the measuring apparatus 1 (that is, the upper limit value of the sixth resistance measurement range that is the highest has been exceeded).

When the resistance value R measured in step 63a is below the lower limit threshold RL of the sixth resistance measurement range, by repeatedly executing the processing in steps included in a route that passes steps 63b, 63d, 63g, 63i and step 63j and returns to step 63a, the processor 10 lowers the resistance measurement range one at a time and specifies the appropriate resistance measurement range where the resistance value R measured in step 63a is within a range that is equal to or above the lower limit threshold RL and is equal to or below the first upper limit threshold RH1 in the determination processing in step 63g or step 63i, before executing the processing in step 63h that displays the measured value as the resistance value R of the resistance.

On the other hand, when the resistance value R of the resistance connected between the input terminals 2 and 3 increases while the processor 10 is executing the resistance measurement process 63 so that the resistance value R falls in a range that exceeds the first upper limit threshold RH1 of the present resistance measurement range and is equal to or below the second upper limit threshold RH2, the processor 10 determines that the resistance value R is within this range in the processing in step 63d, advances the processing to step 63e, and determines whether the present resistance measurement range is the highest resistance measurement range. When, as a result of this determination, the present resistance measurement range is the highest resistance measurement range (in the present embodiment, the sixth resistance measurement range), the processor 10 executes step 63c described above, ends the resistance measurement process 63, and the processing returns to step 51 in the measurement process 50.

Also, when, as a result of the determination in step 63e described above, a higher resistance measurement range than the present resistance measurement range exists, the processor 10 executes a process that raises the resistance measurement range to the next higher resistance measurement range (step 63f), and returns to step 63a. By raising the resistance measurement range one at a time by repeatedly executing steps 63a, 63b, 63d, 63e, and 63f in this way, the processor 10 switches to an appropriate resistance measurement range that is suited to measuring the increased resistance value R. Here, when the present resistance measurement range has been switched to the appropriate resistance measurement range, the resistance value R measured in step 63a will be within a range that is equal to or above the lower limit threshold RL and is equal to or below the first upper limit threshold RH1 of the present resistance measurement range. For this reason, the resistance value R is displayed by the processor 10 as the resistance value R of the resistance in the processing in step 63h which is executed via the determination processing in steps 63b, 63d, and 63g.

Also, when the resistor that was connected between the input terminals 2 and 3 is removed while the processor 10 is executing the resistance measurement process 63 (that is, when the input terminals 2 and 3 are placed in the open state), in step 63a the processor 10 measures (calculates) the resistance value R that exceeds the second upper limit threshold RH2 of the present resistance measurement range. As a result of the determination processing in step 63b, the processor 10 determines that the measured resistance value R exceeds the second upper limit threshold RH2, the processing in step 63c described above (that is, processing that displays "out of input range" on the outputter 11 and processing that sets the first switch 8 in the off state) is immediately executed and then the resistance measurement process 63 ends, and the processing returns to step 51 in the measurement process 50.

In this way, with the measuring apparatus 1, when the input terminals 2 and 3 enter the open state during the execution of the resistance measurement process 63, the first switch 8 is switched to an off state immediately (that is, without executing the processing that raises the resistance measurement range upward one at a time) so that it becomes possible to interpose the protective resistor 7 with a high resistance value on the current supply line Li between the output terminal of the current supplier 9 and the input terminal 3 of the measuring apparatus 1.

On the other hand, when it has been determined in step 62 described above that the terminal voltage Vdc_on is equal to or above 0 V DC but is not equal to or below the full scale voltage Vfs (that is, the voltage exceeds the full scale voltage Vfs or is a negative voltage whose absolute value is below the reference voltage value Vref_dc), the processor 10 then determines whether the terminal voltage Vdc_on is within the forward voltage range (a voltage range that exceeds +0.3V DC but is below +3V DC) (step 64).

When it has been determined in step 64 that the terminal voltage Vdc_on is a voltage value within the forward voltage range, the processor 10 determines that a diode is connected in the forward direction between the input terminals 2 and 3 and displays the terminal voltage Vdc_on on the outputter 11 as the forward voltage of the diode (step 65), and the processing returns to step 51. On the other hand, when it has been determined that the terminal voltage Vdc_on is not a voltage value within the forward voltage range, due to the terminal voltage Vdc_on being neither a voltage value when a resistor is connected (that is, a voltage that is equal to or above 0V and equal to or lower than the full scale voltage Vfs (+0.3V DC)) nor a voltage value when a diode is connected (that is, a voltage in a range that exceeds +0.3V DC and is below +3V DC), the processor 10 displays the terminal voltage Vdc_on as a DC voltage on the outputter 11 (step 66), and the processing returns to step 51.

By doing so, in the measuring apparatus 1, due to the processor 10 executing the measurement process 50 described above, when a high-voltage or low-voltage AC voltage is inputted across the input terminals 2 and 3, the voltage value (the terminal voltage Vac_off) is automatically measured via the input resistor 21 that has a high resistance value and displayed on the outputter 11. Also with the measuring apparatus 1, when the input terminals 2 and 3 are in the open state or when a diode has been connected in the reverse direction, these states are automatically detected and information indicating the open state is displayed on the outputter 11. With the measuring apparatus 1, when a high DC voltage (a voltage whose absolute value exceeds the reference voltage value Vref_dc (in the present embodiment, 6V)) is inputted across the input terminals 2 and 3, the voltage value is automatically measured via the input resistor 21 that has a high resistance value and displayed on the outputter 11, while when a low DC voltage (that is, a DC voltage in one of a voltage range of −6 V or higher and below 0 V and a voltage range of +3V or above and below +6 V) is inputted across the input terminals 2 and 3, the voltage value is automatically measured via the protective resistor 12, whose resistance value is not as high as the protective resistor 7 but is still capable of suppressing the leakage current to below the sensitivity current, and displayed on the outputter 11.

With the measuring apparatus 1, when a resistance with a resistance value R within the range of measured resistances (that is, 0Ω to 60.00 MΩ, inclusive) in the resistance measurement range is connected between the input terminals 2 and 3, the resistance measurement process 63 is executed, there is an automatic switch to the appropriate resistance measurement range out of the plurality of resistance measurement ranges, and the resistance value R is measured and displayed on the outputter 11. Also, when the input terminals 2 and 3 enter an open state during measurement of the resistance value R, the resistance value R measured in this state will exceed the second upper limit threshold RH2, which is used to immediately determine (that is, without executing an operation of raising the resistance measurement range one at a time) that the value is out of the input range for all of the resistance measurement ranges. In this case, an indication that the value is out of the input range is displayed on the outputter 11 and the first switch 8 is set in the off state so that the protective resistor 7 is interposed on the current supply line Li. Also, with the measuring apparatus 1, when a diode is connected in the forward direction between the input terminals 2 and 3, the forward voltage is automatically measured and displayed on the outputter 11.

In this way, with the measuring apparatus 1, when the input terminals 2 and 3 enter the open state while the processor 10 is executing the resistance measurement process 63, the processor 10 determines, based on the resistance value R measured in this state exceeding the second upper limit threshold RH2, that the value is out of the input range immediately (that is, in an extremely short time without executing the operation that raises the resistance measurement range one at a time) regardless of whatever resistance measurement range is the present resistance measurement range, displays an indication of out of input range on the outputter 11, and also sets the first switch 8 in the off state, thereby interposing the protective resistor 7 on the current supply line Li.

This means that according to the measuring apparatus 1, even if the operator (that is, the user of the measuring apparatus 1) immediately attempts to connect the input terminals 2 and 3 to a commercial power supply line after measurement of resistance is completed, the interposing of the protective resistor 7 on the current supply line Li is performed in an extremely short time, which means that it is possible to reliably prevent the occurrence of the state where a leakage current with a large current value is generated due to the application of the commercial power supply voltage (a high voltage such as 100 V AC) across the input terminals 2 and 3 (and a situation where an earth leakage breaker trips due to this).

Also, with the measuring apparatus 1, when the processor 10 detects the open state between the input terminals 2 and 3 as described above in the resistance measurement process, displays an indication that the value is out of the input range on the outputter 11, and sets the first switch 8 in the off state, an indication that the value is out of the input range is displayed in a state where the display content has been switched to the display content in the sixth resistance measurement range that is the highest out of the plurality of resistance measurement ranges (the six resistance measurement ranges in the example described above) (in other words, an indication that the value is out of the input range of the sixth resistance measurement range that is the highest is displayed), and the resistance measurement process ends. This means that according to the measuring apparatus 1, it is possible to clearly inform the operator that the displayed "out of input range" indicates that the upper limit value (60 MΩ) of the resistance measurement range (that is, a range of 0Ω to 60 MΩ, inclusive) of the measuring apparatus 1 is exceeded.

Also, according to the measuring apparatus 1, even if a large AC voltage, such as a commercial power supply voltage, or a large DC voltage is inputted across the input terminals 2 and 3 and the voltage value is measured while maintaining a state where the current supplier 9, which is capable of automatically detecting whether the input terminals 2 and 3 are in the open state, is continuously connected to the input terminal 3 (that is, the input terminal that is not connected to the internal ground G), it is possible to greatly reduce the current value of the leakage current that flows into the current supplier 9 due to the inputting of such high voltages (as one example, to reduce the current value to below the sensitivity current of an earth leakage breaker). Also, the first switch 8 is controlled to be in the on state to short the protective resistor 7 only when a DC voltage inputted across the input terminals 2 and 3 is a low voltage, and by doing so, it is possible to execute the resistance measurement process by supplying the measurement current Im from the current supplier 9 to the resistance connected between the input terminals 2 and 3.

Also, according to the measuring apparatus 1, since a situation where the terminal voltage V1 is directly inputted (applied) to the switch 31, the buffer 26, and/or the A/D converter 5 is avoided when there is the risk of a large terminal voltage V1 being inputted across the input terminals 2 and 3, it is possible to prevent failure of the voltage detector 4 and the A/D converter 5. Also, when the terminal voltage V1 inputted across the input terminals 2 and 3 is a low DC voltage, since it is possible to directly input the terminal voltage V1 via the second voltage detecting line Lv2 into the buffer 26 without dividing (that is, since it is possible to measure the terminal voltage V1 using the lower measurement range), it is possible to measure the terminal voltage V1 with higher precision, and as a result, during the resistance measurement process also, the resistance value of a resistance connected between the input terminals 2 and 3 can be measured with high precision based on the terminal voltage V1.

Note that although a configuration where the lower limit threshold RL, the first upper limit threshold RH1, and the second upper limit threshold RH2 are individually set for each resistance measurement range is used in the example described above, it is also possible to use a configuration that sets a lower limit threshold (a predetermined number of bits), a first upper limit threshold (a predetermined number of bits) and a second upper limit threshold (a predetermined number of bits) for the voltage data Dv to be outputted from the A/D converter 5. By using this configuration, it is possible for the processor 10 to execute the resistance measurement process 63 based on the voltage data Dv using a common lower limit threshold, first upper limit threshold, and second upper limit threshold for all of the resistance measurement ranges.

In addition, although an example where specific numerical values are used as the various voltage values and resistance values is described above to facilitate understanding of the invention, the present invention is not limited to such numerical values, which can be changed to any arbitrary values. Also although an example configuration where the current supplier 9 continuously supplies (outputs) the measurement current Im to the current supply line Li has been described above, it is also possible to use a configuration where the supplying (outputting) of the measurement current Im to the current supply line Li is switched on and off by control by the processor 10, for example.

INDUSTRIAL APPLICABILITY

According to the present invention, even when the user attempts to connect the input terminals to a commercial power supply line, for example, to measure voltage immediately after completing measurement of resistance, the interposing of a protective resistor between one out of the pair of input terminals and the current supplier is performed in an extremely short time, which means that it is possible to reliably prevent a situation where a leakage current with a large current value is generated due to the application of the commercial power supply voltage across the input terminals. This means that the present invention can be widely applied to measuring apparatuses that are capable of resistance measurement and voltage measurement.

The invention claimed is:

1. A measuring apparatus comprising:
a pair of input terminals;
a voltage detector that detects a terminal voltage across the pair of input terminals and outputs a detection voltage in keeping with a voltage value of the terminal voltage;
a current supplier capable of supplying a measurement current across the pair of input terminals; and
a processor that executes a voltage measurement process, which measures the voltage value based on the detection voltage, and a resistance measurement process, which measures a resistance value that is a measurement target connected between the pair of input terminals based on the voltage value measured by the voltage measurement process when the measurement current is supplied and a current value of the measurement current,
wherein a protective resistor is disposed between one input terminal out of the pair of input terminals and the current supplier and a first switch, which is capable of switching to an arbitrary state out of a shorted state and an open state, is connected in parallel to the protective resistor, and
the processor executes the voltage measurement process in a state where the first switch has been switched to the open state to measure the voltage value, compares the measured voltage value with a reference voltage value set in advance, and executes the resistance measurement process by setting the first switch in the shorted state when the measured voltage value is equal to or below the reference voltage value.

2. The measuring apparatus according to claim 1,
wherein the current supplier is configured to be capable of supplying the measurement current with a current value corresponding to one out of a plurality of resistance measurement ranges, and
in the resistance measurement process, the processor is operable, when a resistance value measured in a present resistance measurement range is equal to or above a lower limit threshold of the resistance measurement range and equal to or below a first upper limit threshold of the resistance measurement range, to acquire the measured resistance value as the resistance value of the measurement target, operable when the measured resistance value exceeds the first upper limit threshold of the present resistance measurement range and is equal to or below a second upper limit threshold, which is larger than the first upper limit threshold, to switch to a next higher resistance measurement range, and operable when the measured resistance value exceeds the second upper limit threshold of the present resistance measurement range to set the first switch in the open state and end the resistance measurement process.

3. The measuring apparatus according to claim 2,
further comprising a display,
wherein in the resistance measurement process, the processor is operable, when the measured resistance value exceeds the second upper limit threshold of the present resistance measurement range, to display an indication of out of input range for a highest measurement range out of the plurality of resistance measurement ranges on the display and end the resistance measurement process.

* * * * *